June 23, 1959

CHAANG HUANG ET AL 2,892,100

POWER TRANSISTOR SWITCHING CIRCUITS

Filed Aug. 3, 1955

INVENTORS
CHAANG HUANG
EDWIN SLOBODZINSKI
BY Elmer J. Nealon
ATTORNEY 2,892,100
Patented June 23, 1959

2,892,100

POWER TRANSISTOR SWITCHING CIRCUITS

Chaang Huang, Ipswich, Mass., and Edwin Slobodzinski, Salt Point, N.Y., assignors to Sylvania Electric Products Inc., a corporation of Massachusetts Application August 3, 1955, Serial No. 526,158
5 Claims. (Cl. 307—88.5)

The present invention relates to power transistor switching circuits, and more particularly to bistable circuits employing junction type transistors for switching currents of relatively large size, for example of the order of amperes.

It is an object of the invention to provide means capable of switching currents of the above or comparable magnitudes through load impedances that may require in excess of one watt for operation.

It has become possible, through the development of junction transistors capable of 100 milliamperes collector current or greater, to switch a relatively large current through a load impedance by connecting it directly in series with the collector-emitter circuit. However, in order to achieve satisfactory operation of such a circuit through control of the emitter-base current, two important problems must be solved. First, if control is to be effected through input pulses of appropriate polarity and amplitude, bistability can be accomplished with junction type transistors only by providing an additional transistor, or mate for the operative transistor, thus forming a flip-flop pair. Ordinarily, the operative or power-delivering transistor and its mate are designed to be alternatively operative. It will be apparent that, in view of the need for two transistors, considerable power waste would be experienced if two identical power transistors were used, since the power dissipated in the collector return impedance of one of the mates may serve no useful purpose.

Secondly, it has been found that the use of identical power junction transistors in grounded emitter bistable or flip-flop circuits has the disadvantage of relatively poor trigger sensitivity. This arises from the difficulty of obtaining a sufficient collector voltage swing in one transistor to provide the necessary voltage change in the emitter circuit of the other transistor to effect a rapid change in the collector current of the latter.

On the other hand, it has been found that in bistable flip-flop circuits employing relatively lower power transistors, which are capable of delivering useful power only in the conservative range of up to 50 milliwatts, the trigger sensitivity is greatly improved. It is accordingly an object of the present invention to provide means for taking advantage of the high trigger sensitivity of a low-power transistor to effectuate relatively high current changes in the load circuit of a relatively high power transistor.

A further object is to provide an efficient power switch, wherein the before-mentioned power losses of a symmetrically connected bistable junction transistor circuit are avoided.

With the foregoing and other objects in view, a feature of the present invention resides in the use of bistable flip-flop circuits of unbalanced design, wherein low power transistors are used in conjunction with higher power transistors through which the useful power current is switched.

In one aspect the invention is characterized by the use of a low power transistor as a mate in a flip-flop circuit with a higher power transistor.

In another aspect the invention is characterized by a tandem connection of transistors which provides a means for power amplification, while yet retaining the advantages in terms of trigger sensitivity of a low power transistor circuit.

Other features of the invention reside in the specific circuit arrangements and connections as hereinafter more fully described with reference to the drawings, in which.

Figure 1:
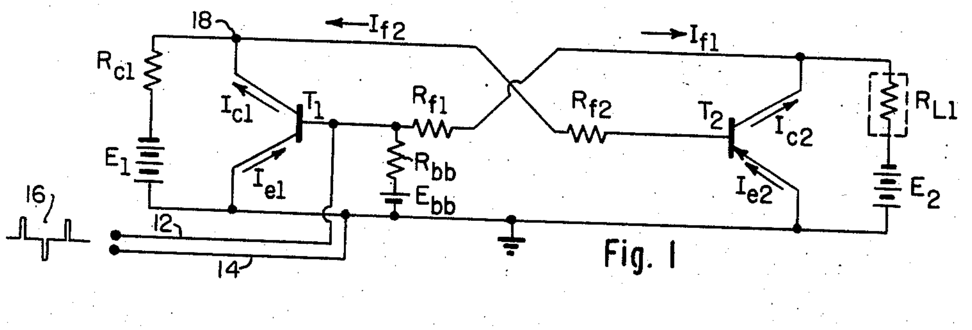
Fig. 1 is a schematic circuit diagram of one form of the invention utilizing a single low power transistor and a single high power transistor as mates, and operating upon input pulses of alternating polarity.

Referring to Fig. 1, there is provided a junction transistor $T_1$ which is of the p-n-p type. It will be apparent from the description that an n-p-n type may also be used provided that appropriate changes in the battery polarities are made, as is well understood in the art. This transistor is preferably of a size that is designed to deliver only a small fraction of the power that is to be delivered to the load. There is also provided a junction transistor $T_2$ of the p-n-p type, which is suitably designed to deliver full current to the load as represented by an impedance $R_{L1}$. These transistors are connected in a flip-flop circuit wherein the respective collectors and bases are interconnected by resistors $R_{f2}$ and $R_{f1}$ to provide the necessary feedback paths.

In the illustrated embodiment, the emitters are grounded. The transistor $T_2$ has its collector connected through the load impedance $R_{L1}$ and a battery $E_2$ to ground. The collector of the transistor $T_1$ is connected through an impedance $R_{c1}$ and a battery $E_1$ to ground.

The input circuit comprises wires 12 and 14 which are connected, respectively, to the base of the transistor $T_1$ and ground across a series circuit comprising a resistor $R_{bb}$ and a battery $E_{bb}$. As indicated by a waveform 16, the circuit is designed to operate upon pulses of alternating polarity. Considerable switching speed can be obtained. For example, in a specific circuit tested, input signals of the order of 1 volt amplitude and less than 1 microsecond mean width were used for power switching at speeds conservatively estimated to be of the order of 30 kilocycles per second.

The operation of the circuit of Fig. 1 is described as follows. In the initial state, it may be assumed that the transistor $T_2$ is "on," that is, having a substantial collector current, and the transistor $T_1$ "off," that is, having substantially no collector current. In this state, a sufficiently large current $I_{c2}$ flows from the collector of the transistor $T_2$ through the load resistor $R_{L1}$ to transfer the desired output power thereto. For example, in a specific embodiment tested which had a battery voltage $E_2$ of 12 volts, the current $I_{c2}$ was 160 milliamperes and produced a 2 watt output in a load impedance $R_{L1}$ of 75 ohms.

From the $V_c-I_c$ (constant $I_b$) curves for the transistor $T_2$, it is observed that there is a certain emitter-base current $I_{f2}$ corresponding to the assumed current $I_{c2}$. In the circuit mentioned above, this was 5 milliamperes for the given transistor. This current flows from the base of the transistor $T_2$, through the resistor $R_{f2}$, the resistor $R_{c1}$, the battery $E_1$ and the emitter of the transistor $T_2$, back to its base.

With the transistor $T_1$ "off," as assumed, substantially no current flows from its emitter to its base. Also, the current $I_{c1}$ is substantially zero. The base of the transistor $T_1$ is slightly positive, being biased in that direction by the battery $E_{bb}$. A current $I_{f1}$ flows through the battery $E_{bb}$, the resistor $R_{bb}$, the resistor $R_{f1}$, the load $R_{L1}$, and the battery $E_2$ to ground, the value of this current being such that, while the base of the transistor $T_1$ is slightly positive, the end of the resistance $R_{f1}$ opposite to the base is slightly negative, as required for the "on" condition of the transistor $T_2$. In the particular example given above the voltage from the collector of the transistor $T_2$ to ground while this transistor was "on" was $-0.15$ volt.

In the absence of an input pulse, the above-described condition of the circuit is stable. To produce the other stable condition it is necessary to apply a negative pulse to the base of the transistor $T_1$. This pulse permits current to flow from the emitter to the base of the transistor $T_1$, and gates a considerable current to the collector circuit thereof. This current flows from the collector to ground through the resistor $R_{c1}$ and the battery $E_1$, causing the potential of the connection 18 to rise to a more positive level than formerly. This shuts "off" the emitter-to-base current in the transistor $T_2$, and consequently the collector current $I_{c2}$.

The design is such that the turning "on" of the transistor $T_1$ causes an increase of current in the resistor $R_{c1}$. In the previously-mentioned example, in which a current of 5 milliamperes circulated through this resistor in the emitter-base path of the transistor $T_2$ when the latter was "on," the "on" current of the transistor $T_1$ increased the current in the resistor $R_{c1}$ to 8 milliamperes, thus assuring the necessary positive voltage swing at the base of the transistor $T_2$ to turn it to the "off" condition.

From the $V_c$—$I_c$ (constant $I_b$) curves for the transistor $T_1$, it is observed that for the assumed "on" condition thereof there is a certain emitter-base current corresponding to the stated value of 8 milliamperes in the collector circuit. This current passes through the resistor $R_{f1}$, the load $R_{L1}$, the battery $E_2$ and emitter of the transistor $T_1$, back to its base. Also, a certain current flows from the resistor $R_{bb}$, through the resistor $R_{f1}$, the load $R_{L1}$ and the battery $E_2$, back to the resistor $R_{bb}$. Thus, the currents from the base of the transistor $T_1$ and the resistor $R_{bb}$ both pass through the resistor $R_{f1}$ and add together to produce a small total current $I_{f1}$ which passes through the load $R_L$. In the example mentioned above, the resultant voltage from the collector of the transistor $T_2$ to ground for its "off" condition was 11.8 volts.

To reinstate the initial condition assumed above, wherein the transistor $T_2$ is "on," it is necessary to supply a positive pulse to the base of the transistor $T_1$. This stops the emitter-to-base current in this transistor, and causes the voltage at the connection 18 to drop. Thus, the emitter-to-base current in the transistor $T_2$ recommences, allowing a considerable current $I_{c2}$ to flow from the collector through the load $R_L$.

Figure 2:
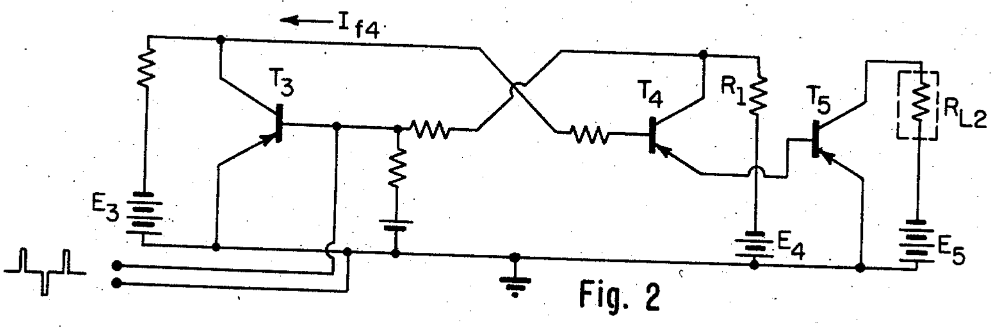
Fig. 2 is a schematic circuit diagram illustrating a modification of the circuit of Fig. 1.

The variant shown in Fig. 2 is similar to that of Fig. 1 in that voltages of alternating polarity are required to change the condition of the circuit. This circuit differs from that of Figure 1 principally in the inclusion of a third transistor. A transistor $T_3$ corresponds to the transistor $T_1$ of Fig. 1, and two transistors $T_4$ and $T_5$ to the transistor $T_2$. The emitter of the transistor $T_4$ is connected to the base of the transistor $T_5$, the emitter of the latter being grounded. The collector of the transistor $T_4$ is connected through a resistor $R_1$ and a battery $E_4$ to ground, and the collector of the transistor $T_5$ is similarly connected through a load impedance $R_{L2}$ and a battery $E_5$ to ground.

Preferably, for this case the transistors $T_3$ and $T_4$ are both of the low power type, and the transistor $T_5$ is of the high power type. The tandem arrangement of the transistors $T_4$ and $T_5$ permits an increased current to flow through the load $R_{L2}$. The operation of the circuit is much like that of Fig. 1, insofar as the transfer from one stable state to the other is concerned. However, in the case where the transistor $T_4$ is "on" the emitter-to-base current therein becomes also the emitter-to-base current of the higher power transistor $T_5$. The presence of the relatively small emitter-to-base impedance of the transistor $T_5$ in the emitter circuit of the transistor $T_4$ has little effect on the current $I_{f4}$, and hence does not appreciably affect the trigger sensitivity.

Any change in the emitter-to-base current in the transistor $T_4$ causes the identical change in the emitter-to-base current of the transistor $T_5$, and since the latter is designed to produce large collector currents, a larger power output is experienced as a result of the tandem connection.

It will be obvious that the tandem arrangement may be extended to three or even more transistors simply by disconnecting the emitter of the transistor $T_5$ from ground, and connecting it to the base of the next succeeding transistor, and so on.

Figure 3:
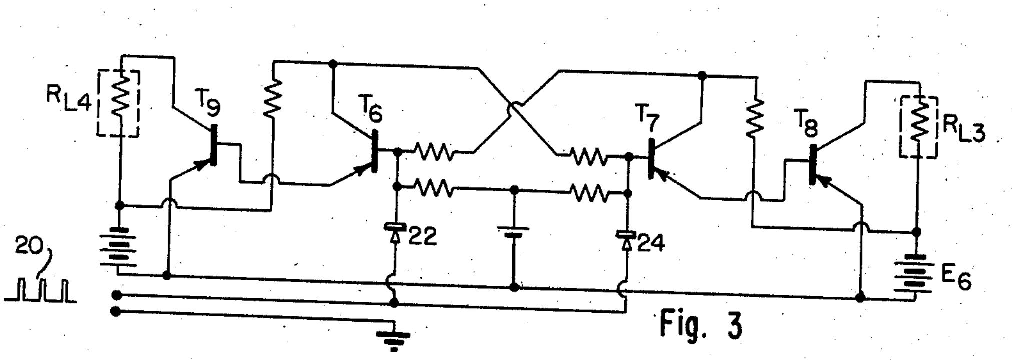
Fig. 3 is a schematic circuit diagram of an alternative embodiment incorporating the invention and designed to operate upon input pulses of one polarity only.

In the embodiment of Fig. 3, the tandem connections of Fig. 2 are employed on both sides of the bistable circuit. Thus, transistors $T_6$ and $T_7$ of the low power type, and transistors $T_8$ and $T_9$ of the higher power type, are provided. In this arrangement, the high trigger sensitivities of transistors $T_6$ and $T_7$ are taken advantage of to provide considerable power to either of two load impedances $R_{L3}$ and $R_{L4}$. The circuit is entirely symmetrical. Also, a steering circuit is provided at the input to permit the transfer from one stable condition to the other by input pulses of single polarity. Thus, a waveform of positive pulses 20, or their inverse, may form a suitable input. The input pulses are gated through rectifiers 22 and 24 to the bases of both transistors $T_6$ and $T_7$. If these pulses are positive, as illustrated, they will stop the emitter-to-base current in the "on" transistor, causing its collector to become more negative, and thus allowing the other transistor to turn "on." Conversely, if the pulses are negative, they will turn "on" the transistor which is in the "off" condition at the time of each impulse, causing the other transistor to turn "off." It will be appreciated that reversal of the rectifiers 22 and 24 is required for operation on negative input pulses.

It will be also noted that the tandem connection of the transistors $T_7$ and $T_8$ includes a single battery $E_6$, which performs a function similar to the two batteries $E_4$ and $E_5$ in Fig. 2.

From the foregoing it will be appreciated that we have provided means for efficient power switching through circuit arrangements involving both low power and high power transistors, whereby we have obtained the advantages of the low power transistors both in terms of trigger sensitivity and low power requirements, while yet switching considerable currents for the purpose of driving one or more load impedances.

Having thus described the invention, we claim:

1. A bistable switching circuit having, in combination, a pair of junction transistors provided with mutual feedback paths joining their respective collectors and bases, and a third junction transistor having an appreciably greater collector current capacity than one of the transistors of said pair, a grounded emitter and connections for a load impedance in its collector-emitter circuit, one of said pair having a grounded emitter and the other having its emitter connected to the base of said third transistor.

2. A bistable switching circuit having, in combination, a pair of junction transistors provided with mutual feedback paths joining their respective collectors and bases, a direct-current source and an impedance connected between a ground and the collector of each of said transistors, one of said transistors having a grounded emitter, and a third transistor having connections for a load impedance in its collector-emitter circuit including said source of the other transistor, the emitter of said other transistor being connected to the base of said third transistor.

3. A bistable switching circuit having, in combination, a first pair of junction transistors provided with mutual feedback paths joining their respective collectors and bases, and a second pair of junction transistors each having an appreciably greater collector current capacity than each of said first pair, the emitter of each of said first pair being connected to the base of one of said second pair, one of said second pair having connections for a load impedance in its collector-emitter circuit.

4. A bistable switching circuit having, a combnation, a first pair of junction transistors provided with mutual feedback paths joining their respective collectors and bases, an input circuit for applying pulses to one of said first pair, and a second pair of junction transistors each having an appreciably greater collector current capacity than each of said first pair, the emitter of each of said first pair being connected to the base of one of said second pair, one of said second pair having connections for a load impedance in its collector-emitter circuit.

5. A bistable switching circuit having, in combination, a pair of junction transistors provided with mutual feedback paths joining their respective collectors and bases, and a third junction transistor having an appreciably greater collector current capacity than one of the transistors of said pair and connections for a load impedance in its collector-emitter circuit, a transistor of said pair having its emitter connected to the base of said third transistor.

References Cited in the file of this patent

UNITED STATES PATENTS

| | | |
|---|---|---|
| 2,531,076 | Moore | Nov. 21, 1950 |
| 2,605,306 | Eberhard | July 29, 1952 |
| 2,622,212 | Anderson et al. | Dec. 16, 1952 |
| 2,764,343 | Diener | Sept. 25, 1956 |
| 2,776,382 | Jensen | Jan. 1, 1957 |
| 2,776,420 | Woll | Jan. 1, 1957 |
| 2,801,298 | Mital | July 30, 1957 |

OTHER REFERENCES

Shea book, John Wiley and Son, Transistor Circuits, p. 116.